United States Patent
Katti et al.

(10) Patent No.: US 11,921,141 B2
(45) Date of Patent: Mar. 5, 2024

(54) BROADBAND RADIATION SENSOR BASED ON A RESONANTLY-COUPLED GRAPHENE SNS JUNCTION

(71) Applicant: California Institute of Technology, Pasadena, CA (US)

(72) Inventors: Raj M. Katti, Pasadena, CA (US); Harpreet Singh Arora, Pasadena, CA (US); Keith C. Schwab, Pasadena, CA (US); Michael L Roukes, Pasadena, CA (US); Stevan Nadj-Perge, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 484 days.

(21) Appl. No.: 17/191,443

(22) Filed: Mar. 3, 2021

(65) Prior Publication Data
US 2021/0311101 A1    Oct. 7, 2021

Related U.S. Application Data

(60) Provisional application No. 62/984,451, filed on Mar. 3, 2020.

(51) Int. Cl.
| | |
|---|---|
| *H01L 31/112* | (2006.01) |
| *G01R 29/08* | (2006.01) |
| *G01R 31/28* | (2006.01) |
| *H01L 31/02* | (2006.01) |
| *H01L 31/101* | (2006.01) |
| *H10N 60/12* | (2023.01) |

(52) U.S. Cl.
CPC ..... *G01R 29/0878* (2013.01); *G01R 31/2824* (2013.01); *H01L 31/02019* (2013.01); *H01L 31/1013* (2013.01); *H01L 31/112* (2013.01); *H10N 60/12* (2023.02)

(58) Field of Classification Search
None
See application file for complete search history.

(56) References Cited

U.S. PATENT DOCUMENTS

| | | | |
|---|---|---|---|
| 2013/0193404 A1* | 8/2013 | Koppens | H01L 31/0475 977/734 |
| 2017/0092834 A1* | 3/2017 | Fong | H10N 60/12 |
| 2018/0337324 A1* | 11/2018 | Fong | G01J 5/20 |
| 2020/0363267 A1* | 11/2020 | Fong | G01J 5/06 |

* cited by examiner

*Primary Examiner* — Marcus H Taningco
(74) *Attorney, Agent, or Firm* — Kilpatrick Townsend & Stockton LLP

(57) ABSTRACT

A graphene-based broadband radiation sensor and methods for operation thereof are disclosed. The radiation sensor includes an electrical signal path for carrying electrical signals and one or more resonance structures connected to the electrical signal path. Each resonance structure includes a resonator having a resonant frequency. Each resonance structure also includes a graphene junction connected in series with the resonator, the graphene junction including a graphene layer and having an impedance that is dependent on a temperature of the graphene layer. Each resonance structure further includes a heating element that is thermally coupled to the graphene layer and is configured to receive an incident photon, where the temperature of the graphene layer increases in response to the heating element receiving the incident photon.

20 Claims, 12 Drawing Sheets

BROADBAND RADIATION SENSOR BASED ON A RESONANTLY-COUPLED GRAPHENE SNS JUNCTION

CROSS-REFERENCES TO RELATED APPLICATIONS

This application claims the benefit of priority to U.S. Provisional Patent Application No. 62/984,451, filed Mar. 3, 2020, entitled "BROADBAND RADIATION SENSOR BASED ON A RESONANTLY-COUPLED GRAPHENE SNS JUNCTION," the entire contents of which is hereby incorporated by reference for all purposes.

STATEMENT AS TO RIGHTS TO INVENTIONS MADE UNDER FEDERALLY SPONSORED RESEARCH AND DEVELOPMENT

This invention was made with government support under Grant No. DMR1753306 awarded by the National Science Foundation. The government has certain rights in the invention.

BACKGROUND OF THE INVENTION

Photon detectors, including detectors of single photons and/or photon flux, are indispensable tools in many areas of science and technology, including radio astronomy, quantum information processing, and dark matter detection. However, many state-of-the-art photon detectors are limited to a detection regime above the near-infrared. For example, high efficiency single photon counting in superconducting nanowire single photon detectors (SNSPDs) is typically limited to wavelengths less than 10 microns.

Despite the progress made in the development of photon detectors, there is a need in the art for improved methods and systems related to broadband radiation sensors.

SUMMARY OF THE INVENTION

Due to the exceptional electronic and thermal properties, graphene is believed to be a key material for bolometry, calorimetry, and photon detection. Since it is only one atom thick, its heat capacity goes well below the traditionally synthesized thin films, and its thermal conductivity can be controlled by placing graphene on different substrates. However, despite its relatively simple electronic structure, mechanisms that facilitate heat transfer away from the electronic degrees of freedom in graphene still remain to be understood. For example, previous transport measurements in graphene encapsulated within boron nitride identified that electron-phonon coupling in graphene bulk is a dominant source of electron thermalization. Yet, these experiments suggest a surprisingly large electron-phonon coupling strength: hundreds of times larger than the theoretical predictions. Additionally, recent local thermometry measurements in related systems highlight the importance of the localized defects in electron cooling.

As described herein, the thermal response of graphene can be measured by integrating it within a multi-terminal superconducting device coupled to a microwave resonator. In contrast with typical critical current measurements that involve switching between superconducting and resistive states, changes in Josephson inductance caused by heating are measured directly. This approach allows the thermal response to be continuously monitored with minimal back-action and further allows the thermalization of both electrons and holes to be separately probed. For both carrier types, power-law scaling of the thermal conductance has been found to be consistent with a resonant electronic scattering mechanism that occurs at the interface between graphene and the superconducting leads. The insights obtained provide an understanding of thermalization pathways in superconducting graphene circuits, which may be important for understanding and developing graphene-based thermal detectors.

Presented herein is a device architecture for straightforward design and readout of arrays of frequency-multiplexed graphene photodetectors. The detection mechanism allows operation at the lowest temperatures available to a dilution refrigerator (<100 mK), where graphene photodetectors are most sensitive, all the way up to 10 K, where liquid-helium cryostats may be employed in place of expensive dilution refrigerators. Further, the readout mechanism is nondestructive, allowing the state of the photodetector to be continuously monitored with minimal back-action from the readout chain. Finally, the device architecture allows for in situ frequency tuning to compensate for non-idealities in device fabrication and/or to modify spectral bandwidth in real time. Taken together, the benefits of this device architecture present a significant step towards readout of arrays of graphene photodetectors for tackling the most difficult problems in radio astronomy, quantum information processing, and dark matter detection.

A summary of the various embodiments of the invention is provided below as a list of examples. As used below, any reference to a series of examples is to be understood as a reference to each of those examples disjunctively (e.g., "Examples 1-4" is to be understood as "Examples 1, 2, 3, or 4").

Example 1 is a radiation sensor comprising: an electrical signal path for carrying electrical signals; and a resonance structure connected to the electrical signal path, the resonance structure comprising: a resonator having a resonant frequency; a graphene junction connected in series with the resonator, the graphene junction including a graphene layer and having an impedance that is dependent on a temperature of the graphene layer; and a heating element that is thermally coupled to the graphene layer and is configured to receive an incident photon, wherein the temperature of the graphene layer increases in response to the heating element receiving the incident photon.

Example 2 is the radiation sensor of example(s) 1, wherein the electrical signal path is coupled to at least one port through which electrical measurements can be made to detect a shift in the resonant frequency of the resonator.

Example 3 is the radiation sensor of example(s) 2, wherein the electrical measurements include S-parameter measurements.

Example 4 is the radiation sensor of example(s) 1, wherein the heating element includes a heater line that is connected to the graphene layer at one end of the heater line.

Example 5 is the radiation sensor of example(s) 1, further comprising: a back gate voltage circuit that applies a back gate voltage to the graphene junction.

Example 6 is the radiation sensor of example(s) 1, wherein the graphene junction is a superconductor-graphene-superconductor (S-G-S) junction.

Example 7 is the radiation sensor of example(s) 1, wherein the resonator comprises Niobium Titanium Nitride (NbTiN).

Example 8 is the radiation sensor of example(s) 1, further comprising: a second resonance structure connected to the electrical signal path, the second resonance structure comprising: a second resonator having a second resonant frequency different from the resonant frequency; a second graphene junction connected in series with the second resonator, the second graphene junction including a second graphene layer and having a second impedance that is dependent on a second temperature of the second graphene layer; and a second heating element that is thermally coupled to the second graphene layer and is configured to receive a second incident photon, wherein the temperature of the second graphene layer increases in response to the second heating element receiving the second incident photon.

Example 9 is a method of operating a radiation sensor, the method comprising: receiving an incident photon at a heating element of a resonance structure of the radiation sensor; heating a graphene layer of a graphene junction of the resonance structure in response to receiving the incident photon; changing an impedance of the graphene junction in response to heating the graphene layer; shifting a resonant frequency of a resonator of the resonance structure in response to changing the impedance of the graphene junction; and receiving electrical signals at one or more ports coupled to an electrical signal path of the radiation sensor, wherein the resonance structure is connected to the electrical signal path.

Example 10 is the method of example(s) 9, wherein the electrical signals are provided at the one or more ports to perform electrical measurements to detect a shift in the resonant frequency of the resonator.

Example 11 is the method of example(s) 10, wherein the electrical measurements include S-parameter measurements.

Example 12 is the method of example(s) 9, wherein the heating element includes a heater line that is connected to the graphene layer at one end of the heater line.

Example 13 is the method of example(s) 9, further comprising: applying a back gate voltage to the graphene junction using a back gate voltage circuit.

Example 14 is the method of example(s) 9, wherein the graphene junction is a superconductor-graphene-superconductor (S-G-S) junction.

Example 15 is the method of example(s) 9, wherein the resonator comprises Niobium Titanium Nitride (NbTiN).

Example 16 is a method of making electrical measurements using a radiation sensor, the method comprising: providing an input signal at one or more ports coupled to an electrical signal path of the radiation sensor, wherein the radiation sensor comprises a resonance structure connected to the electrical signal path, the resonance structure comprising a resonator, a graphene junction connected in series with the resonator and including a graphene layer, and a heating element that converts an incident photon into heating of the graphene layer; receiving an output signal at the one or more ports coupled to the electrical signal path; comparing the output signal to the input signal to detect a shift in a resonant frequency of the resonator; and detecting the incident photon based on the shift in the resonant frequency of the resonator.

Example 17 is the method of example(s) 16, wherein the electrical measurements include S-parameter measurements.

Example 18 is the method of example(s) 16, wherein the heating element includes a heater line that is connected to the graphene layer at one end of the heater line.

Example 19 is the method of example(s) 16, wherein the graphene junction is a superconductor-graphene-superconductor (S-G-S) junction.

Example 20 is the method of example(s) 16, wherein the resonator comprises Niobium Titanium Nitride (NbTiN).

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and various ways in which it may be practiced.

Figure 1:
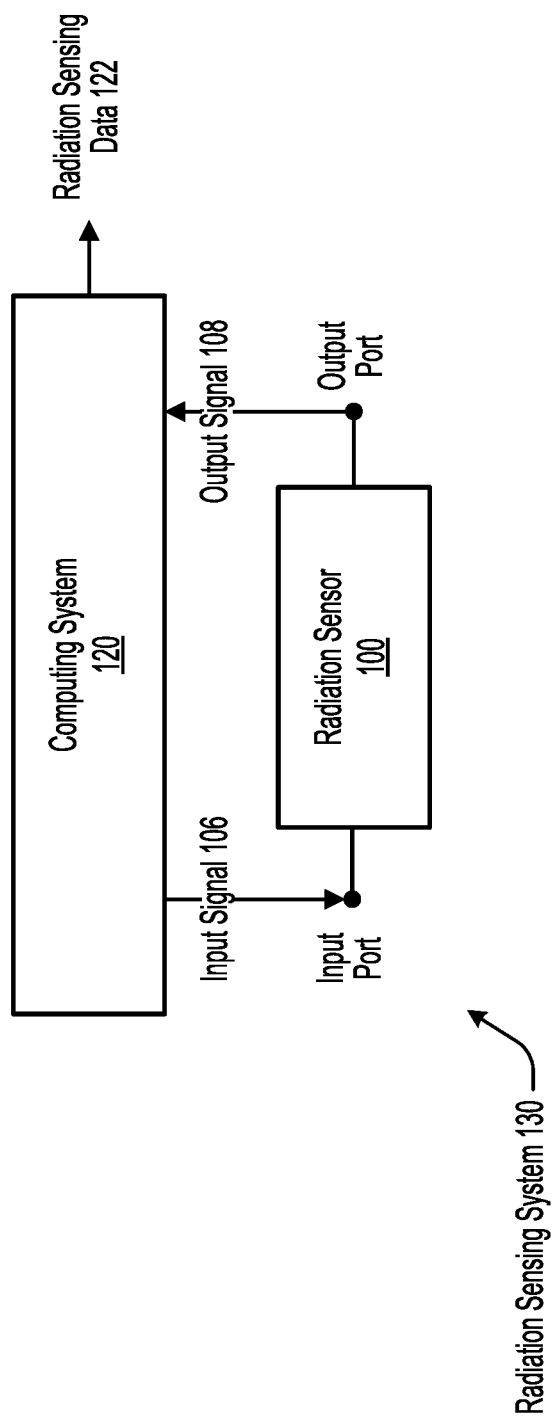
FIG. 1 illustrates an example of a radiation sensing system according to an embodiment of the present invention.

In the appended figures, similar components and/or features may have the same numerical reference label. Further, various components of the same type may be distinguished by following the reference label with a letter or by following the reference label with a dash followed by a second numerical reference label that distinguishes among the similar components and/or features. If only the first numerical reference label is used in the specification, the description is applicable to any one of the similar components and/or features having the same first numerical reference label, irrespective of the suffix.

DETAILED DESCRIPTION OF THE INVENTION

Graphene photodetectors present an opportunity to push photon detection to the mid-infrared, far-infrared, and microwave regimes. Exploiting graphene's unprecedented low-carrier density, restricted thermalization, and relative ease of fabrication, substantial effort in the last decade has gone into developing graphene-based, broadband detectors of individual photons and photon flux.

When graphene is contacted using superconducting electrodes, the resulting Josephson coupling and the corresponding supercurrent are highly dependent on electron temperature. Accordingly, graphene Josephson junctions (gJJs) are particularly promising for detecting ultra-small thermal responses at milli-Kelvin temperatures. Moreover, gJJs can be tuned in many ways, as graphene couples well with a variety of superconductors to form highly transparent junctions, enabling supercurrents to persist over several microns.

Using different superconductors, junction geometries, and operation at different carrier densities allows for a range of specific optimizations needed to detect small heat and optical signals. To achieve the highest sensitivity, for example, one can choose to operate at the lowest temperatures and employ superconductors with a small superconducting gap, similar to the approach that is taken in conventional superconducting nanowire-based detectors. If a large dynamic range is required, tuning the critical currents in graphene junctions by controlling carrier density can provide another degree of freedom providing additional flexibility in design.

Despite the significant progress in integrating graphene with superconducting nanoelectronic devices, the understanding of thermalization of electrons and holes in these systems is still incomplete. Furthermore, conventional readout methods of graphene photodetectors have required lengthy averaging times or destructive, non-continuous monitoring. Such methods have largely been focused on readout of individual devices. Scaling graphene photodetectors from individual devices to arrays may need a mechanism capable of simultaneous, fast, and continuous readout of thousands of devices with minimal back-action from the measurement chain.

In many transport measurements, thermalization in gJJs is primarily driven by the electron-phonon interaction in the graphene bulk, as the diffusion of unpaired electrons into the metallic leads is suppressed due to a superconducting gap. However, in the case where graphene is encapsulated within hexagonal boron nitride (hBN), there are significant discrepancies between the deduced values of electron-phonon coupling from the experimental thermalization rates and theoretical predictions.

Such a discrepancy is not expected for materials with a simple band structure such as graphene, where both the electronic and phonon spectrum can be readily calculated. Further, recent scanning superconducting quantum interference device (SQUID) experiments, which provide spatially-resolved thermal imaging of graphene, have revealed that when electronic transport in graphene is ballistic, signatures of electron thermalization are observed only near physical edges, local defects, and close to metallic contacts. However, signatures of such boundary mediated thermalization have not been evident in transport measurements.

Some embodiments described herein provide for a broadband radiation sensor that may include a resonantly-coupled graphene superconductor—normal conductor—superconductor (SNS) junction. The functionality of such a broadband radiation sensor is demonstrated by performing thermal measurements on a high-quality graphene sample in which the temperature is read out with a superconducting microwave resonator. This has enabled, for the first time, observation of a scaling exponent that is consistent with resonant electron-phonon coupling theory. The described device architecture can be used for graphene-based, far-infrared and microwave regime detector pixels that can be scaled into large arrays.

In some embodiments, microwave signals are sent down a measurement line, transmitted past the on-chip resonator/graphene device, and amplified for readout. The resonator/graphene device presents an electrical impedance to the measurement line that diminishes microwaves signals that are transmitted past the resonator at a particular resonant frequency. This yields a resonance feature as a function of microwave signal frequency. This resonance feature can be continuously monitored with minimal disturbance to the graphene flake.

In some embodiments, a SNS-type Josephson Junction is integrated into a graphene flake. The SNS junction is comprised of two metallic leads, where the metal is a superconducting material such as aluminum, separated by some small length of graphene. The SNS junction presents an electrical impedance to an on-chip resonator fabricated from sputtered Niobium Titanium Nitride (NbTiN). The electrical impedance of the SNS junction depends, with high sensitivity, on the temperature and the carrier density of the graphene flake. The normal conductor of the SNS junction may be comprised of Van der Waals structures including monolayer and multi-layer structures, a semiconductor-based structure, or metallic structures. The superconductor of the SNS junction may be comprised of aluminum or other low critical temperature (Tc) superconductors, niobium or other mid-range-Tc superconductors, or high-Tc superconductors.

In some embodiments, changes in the electrical impedance of the SNS junction change the boundary condition of the resonator, which changes the resonant frequency of the resonance feature. Therefore, a change in the temperature or carrier density of the graphene flake changes the resonant frequency of the resonance feature. These changes in resonant frequency can be continuously and sensitively monitored by the measurement line.

Embodiments described herein demonstrate that graphene can provide the basis for a scalable, far-IR or microwave detector-array technology. Its utility is based on the optimization of three key attributes: responsivity, thermal isolation, and multiplexing. Their optimization, in turn, may benefit from simultaneous or concurrent optimization of multiple, mutually-interacting parameters. The hBN-encapsulated graphene device described herein provides large supercurrents, sub-microsecond response times, and a separate heater and readout port for broad-spectrum energy detection. The superconducting resonator that is employed permits straight-forward frequency multiplexing of many devices on a single feedline.

While detectors based on junction switching (between the zero and finite voltage state) benefit from simplicity of fabrication and readout, they are inherently threshold detectors. Accordingly, they may only register a "count" when the incident photon energy is above a given threshold, and therefore forfeit the possibility of energy spectroscopy provided by the linear, resonantly-coupled graphene detector architecture described herein. Furthermore, threshold detectors intrinsically provide a slower response, which is limited by the cooling and resetting of the junction after a photon absorption event. The graphene-based detectors provided by embodiments of the present invention enable a variety of novel applications, including dark matter detection, and benefit from simultaneous or concurrent optimization of all of these aforementioned properties.

Graphene-insulator-superconductor (G-I-S) junctions and superconductor-graphene-superconductor (S-G-S) junctions operate according to different physical principles, which leads to important differences in fabrication processes, device architecture, and measurement readout. A physical phenomenon occurring in an S-G-S junction is the flow of supercurrent between the superconducting leads that is mediated by electron-hole reflections at the graphene/superconductor boundaries. In this case, Cooper pairs (paired electrons or holes in the superconductor) are removed from one superconducting lead and deposited in the other when mediated by the transport of unpaired electrons or holes in the graphene flake.

By contrast, normal current (non-supercurrent) flow occurs in G-I-S junctions. In this case, current is mediated by high-energy electrons (or holes) in graphene that tunnel through the insulating layer into the superconductor as quasiparticles. Increases in the normal current can be achieved by applying a positive bias voltage or increasing the graphene temperature since both of these processes increase the number of electrons with energy above the threshold tunneling energy set by the gap energy of the superconductor.

The difference in physical mechanisms between these two types of junctions leads to differences in fabrication processes. S-G-S junctions are typically fabricated by etching into a stack of hBn/graphene/hBn to expose the edge of the graphene flake, followed by deposition of a superconducting metal to create a low-impedance, high-transparency contact between the graphene and superconductor. The insulating hBn layers reduce disorder in the graphene flake and enhance mobilities of the charge carriers.

By contrast, G-I-S junctions are often fabricated by stacking a graphene flake and hBn layer on a superconductor to ensure an uninterrupted insulating layer between the graphene and the superconductor. This produces a high-impedance contact between the graphene flake and the superconductor. Etching the hBn layer can sometimes be performed to thin the hBn layer and improve the probability of quantum tunneling, but direct contact between the graphene and superconductor will render this type of junction unusable. Other methods of fabricating these junctions exist.

The difference in impedance between these two types of junctions lead to different device architectures and readout methods. Due to the Josephson current-voltage relations, an S-G-S junction produces an effective inductance when incorporated into an electrical circuit. This fact, combined with its low impedance, mean that it is operated in series with a resonator, so that changes in flake temperature can be transduced into shifts of the resonant frequency. These frequency shifts can be detected in phase/amplitude shifts of S-parameter measurements or in the amplitude shifts of transmitted/reflected tone. By contrast, G-I-S junctions appear as an effective resistance when incorporated into electrical circuits. Due to its high impedance, it is typically placed in parallel with a resonator. Temperature shifts of the graphene flake are transduced into changes in resistance, which are subsequently transduced into shifts of the quality factor of the resonance.

In the following description, various examples will be described. For purposes of explanation, specific configurations and details are set forth in order to provide a thorough understanding of the examples. However, it will also be apparent to one skilled in the art that the example may be practiced without the specific details. Furthermore, well-known features may be omitted or simplified in order not to obscure the embodiments being described.

FIG. 1 illustrates an example of a radiation sensing system 130, according to some embodiments of the present disclosure. Radiation sensing system 130 may include a computing system 120 and a radiation sensor 100. Computing system 120 may include various processors, memories, input/output devices, and other computing elements that allow computing system 120 to, among other tasks, generate an input signal 106, provide input signal 106 at an input port of radiation sensor 100, receive an output signal 108 at an output port of radiation sensor 100, and process/analyze output signal 108 (along with input signal 106) to generate radiation sensing data 122, which may include data indicative of photon(s)/radiation reaching and being sensed by radiation sensor 100, as will be described below.

In some embodiments, input signal 106 and output signal 108 are electrical signals at microwave frequencies. In such embodiments, computing system 120 may make S-parameter measurements using input signal 106 and output signal 108. For example, in some implementations, computing system 120 may make $S_{21}$ measurements by providing input signal 106 at the input port and receiving output signal 108 at the output port, as is shown in the illustrated embodiment. Alternatively or additionally, computing system 120 may make $S_{11}$ measurements by both providing input signal 106 and receiving output signal 108 at the input port. Other S-parameter measurements (or other microwave measurements) may be made by computing system 120 in a similar manner. Each of these measurements may be made to generate radiation sensing data 122 indicative of photon(s)/radiation detected by radiation sensor 100.

In some implementations, radiation sensor 100 may be a multiplexable (multi-channel) broadband radiation sensor. In some implementations, radiation sensor 100 may be capable of sensing radiation flux and/or of single-shot energy quanta, such as phonons and/or photons, with energy resolution down to the microwave regime and number resolution down to the single-quantum regime.

Figure 2:
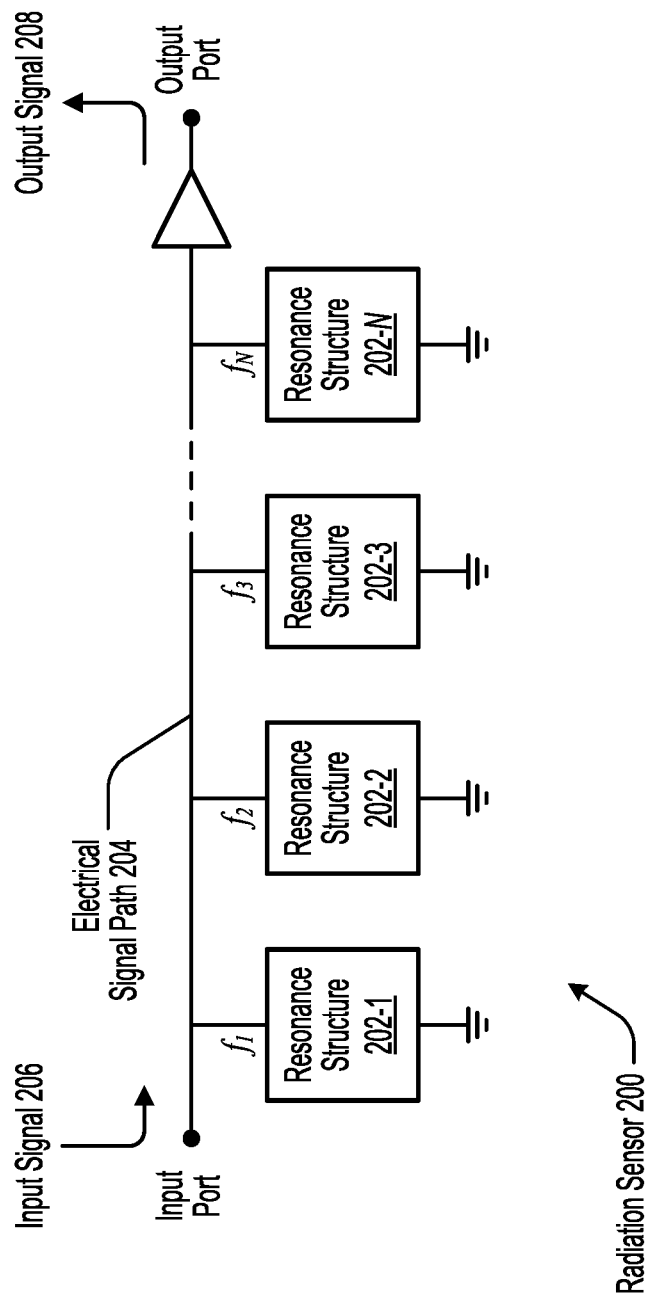
FIG. 2 illustrates an example of a radiation sensor according to an embodiment of the present invention.

FIG. 2 illustrates an example of a radiation sensor 200, according to some embodiments of the present disclosure. Radiation sensor 200 may include an electrical signal path 204 having at one end an input port for receiving an input signal 206 from a computing system and, at the other end, an output port for sending an output signal 208 to the computing system. Radiation sensor 200 may also include one or more resonance structures 202 that are connected to electrical signal path 204. In the illustrated example, radiation sensor 200 includes N resonance structures 202, where N may be greater than or equal to one. For example, in some embodiments, radiation sensor 200 may include a single resonance structure 202.

Resonance structures 202 may have different resonant frequencies $f_1, f_2, \ldots, f_N$ (or operating frequencies) that are sufficiently spaced apart such that resonance structures 202 may be operated independently from each other. In some embodiments, input signal 206 may include different, band-limited frequency components for each of the resonant frequencies, and output signal 208 may similarly include band-limited frequency components for each of the resonant frequencies, where the frequency component for one resonant frequency (e.g., $f_1$) of input signal 206 may not affect any other frequency components (e.g., $f_2, \ldots, f_N$) of output signal 208 except for the frequency component for the same resonant frequency (e.g., $f_1$) of output signal 208.

Figure 3:
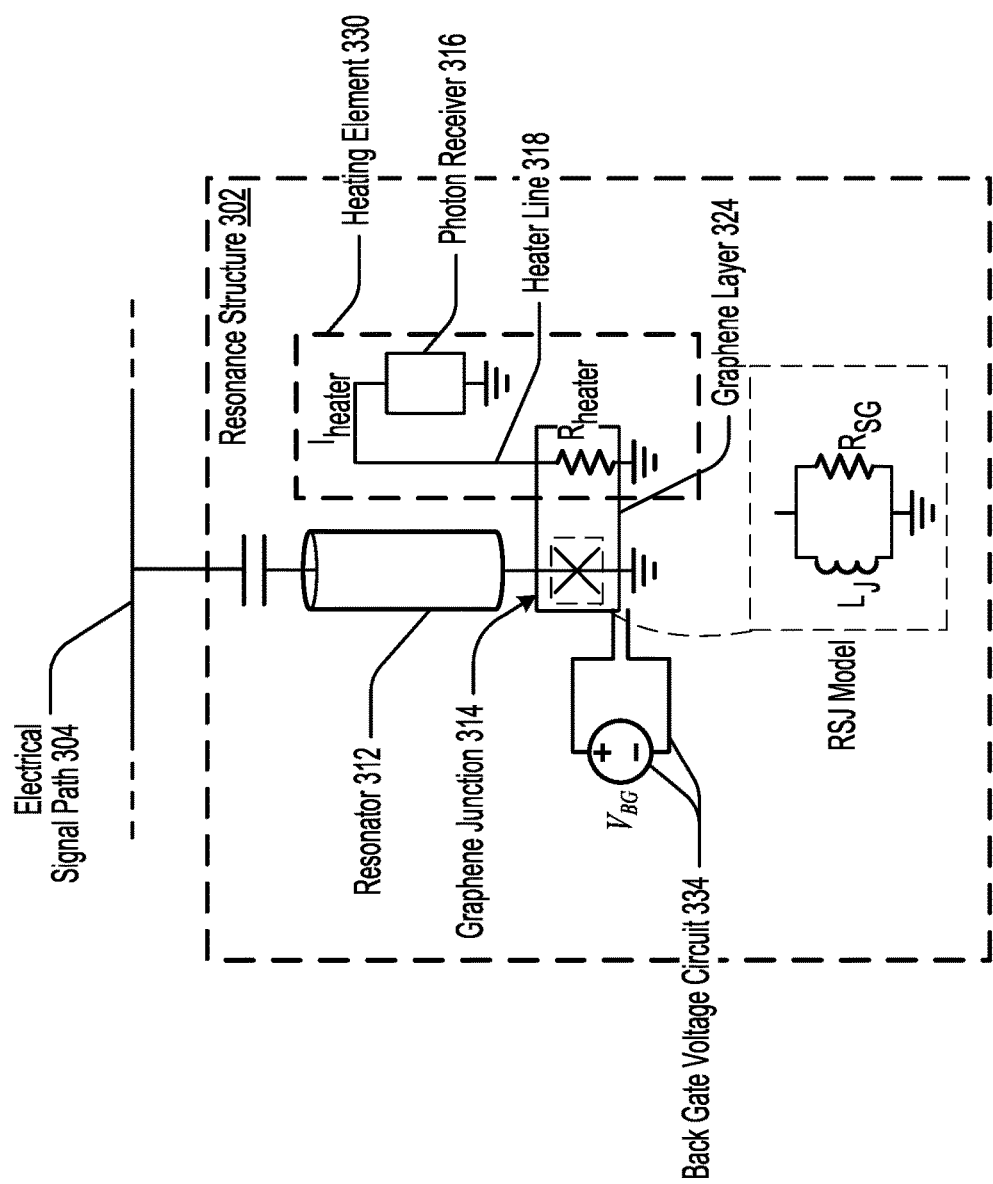
FIG. 3 illustrates an example of a resonance structure according to an embodiment of the present invention.

FIG. 3 illustrates an example of a resonance structure 302, according to some embodiments of the present disclosure. Resonance structure 302 may include a resonator 312, a graphene junction 314, a back gate voltage circuit 334, and a heating element 330. Resonator 312 may be connected to an electrical signal path 304 (optionally via a coupling capacitor), and graphene junction 314 may be connected to resonator 312 on one end and to ground on the other end. For example, graphene junction 314 may be connected in series with resonator 312 such that graphene junction 314 is connected between resonator 312 and ground, and such that the only ground connection for resonator 312 is through graphene junction 314.

Resonator 312 may be associated with a resonant frequency (or operating frequency) f that is dependent on the impedance of graphene junction 314. In some embodiments, graphene junction 314 may be an S-G-S junction and its impedance may be modeled as the parallel sum of a dissipationless branch of inductance $$L_j = \frac{\phi_0/2\pi}{I_c}$$

and a dissipative branch of resistance $R_{SG}$, as shown by the inset diagram in FIG. 3. The impedance of graphene junction 314 may be dependent on the temperature of a graphene layer 324 (alternatively referred to as a graphene flake) of graphene junction 314. For example, in some embodiments, an increase in the temperature of graphene layer 324 may cause the impedance of graphene junction 314 and the resonant frequency of resonator 312 to decrease, and a decrease in the temperature of graphene layer 324 may cause the impedance of graphene junction 314 and the resonant frequency of resonator 312 to increase.

The temperature of graphene layer 324 may be modified by heating element 330, which may be thermally coupled to graphene layer 324. Heating element 330 may include a photon receiver 316 and a heater line 318. At one end, heater line 318 may be electrically and/or thermally coupled to photon receiver 316, and at the other end, heater line 318 may be electrically and/or thermally coupled to graphene layer 324 (as represented by a resistor symbol $R_{heater}$ in FIG. 3). For example, heater line 318 may be embedded in graphene layer 324. Upon receiving a photon, photon receiver 316 may cause the photon's energy to travel along heater line 318 to cause heating of graphene layer 324. In some implementations, heater line 318 may comprise a waveguide for heralding photons to the two-dimensional electron gas (2DEG) and/or may be capable of impedance matching the impedance of the Van der Waals structures to external circuitry.

The resonant frequency of resonator 312 may be finetuned by a back gate voltage $V_{BG}$ that is applied by back gate voltage circuit 334 to graphene junction 314. Specifically, the back gate voltage $V_{BG}$ may be applied to a graphite back gate of graphene junction 314. In some implementations, back gate voltage $V_{BG}$ may allow for the DC voltage tuning of the 2DEG carrier density and corresponding in situ tuning of the resonant frequency of the radiation sensor.

In some implementations, resonator 312 may be designed for low characteristic impedance and may be made of NbTiN. Resonator 312 may be coupled to the external microwave line (e.g., electrical signal path 304) via a coupling capacitor and may be terminated by a S-G-S junction (e.g., graphene junction 314). Characterization and/or operation of the device may be performed by sending in a microwave tone and measuring transmission coefficient $S_{21}$. Changes in the junction's electrical impedance may shift the resonant frequency of the NbTiN resonator. A dedicated heater port (e.g., heating element 330) allows application of Joule heat to the graphene flake, thereby electrically isolating the heating and readout ports, while maintaining a thermal link between them. The resistance between the heater port and the ground may be ~1 kΩ.

In some implementations, resonator 312 may comprise a resonant cavity with one end contacting an S-N-S junction (e.g., graphene junction 314) and the other end contacting a readout line (e.g., electrical signal path 304). The resonant cavity may be comprised of quarter-lambda resonator of lumped-element or coplanar waveguide (CPW)-type, a half-lambda resonator of lumped-element or CPW-type, etc.

Figure 4A:
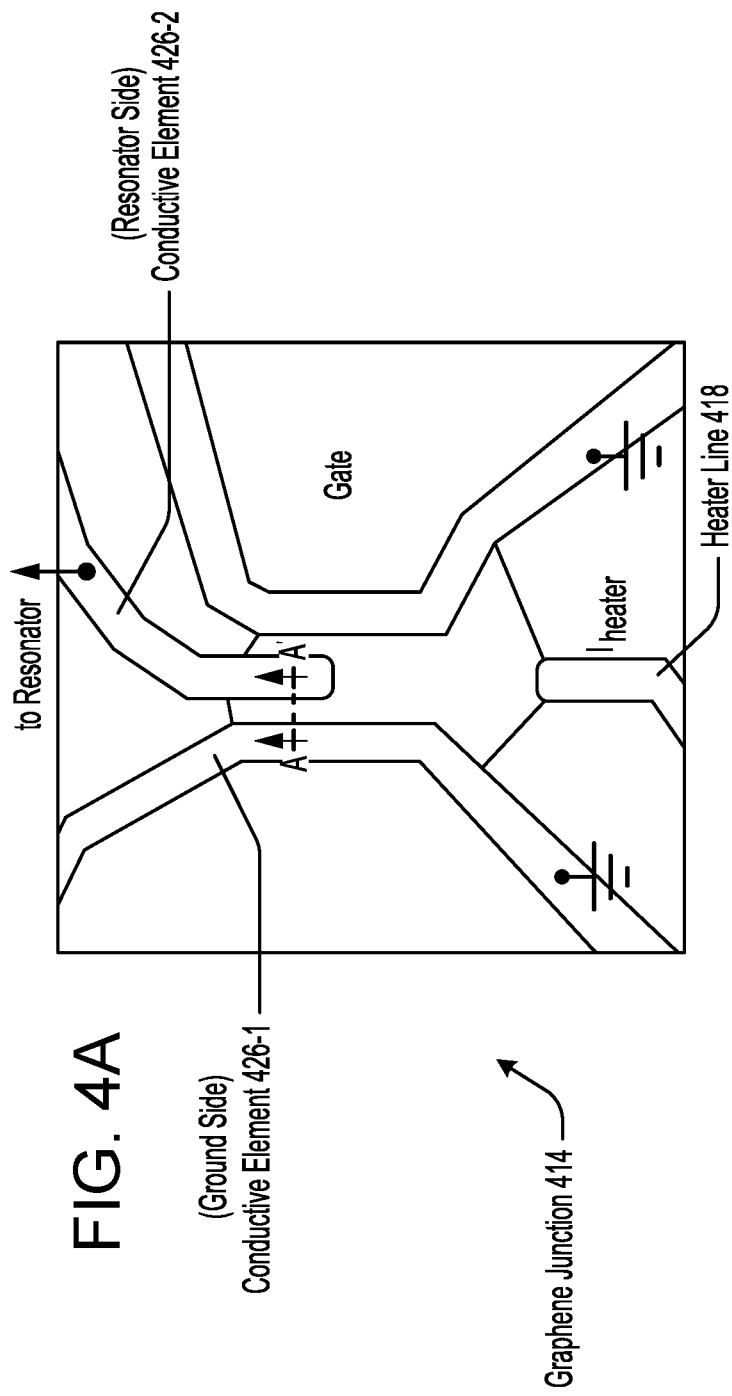
FIGS. 4A and 4B illustrate an example of a graphene junction according to an embodiment of the present invention.
Figure 4B:
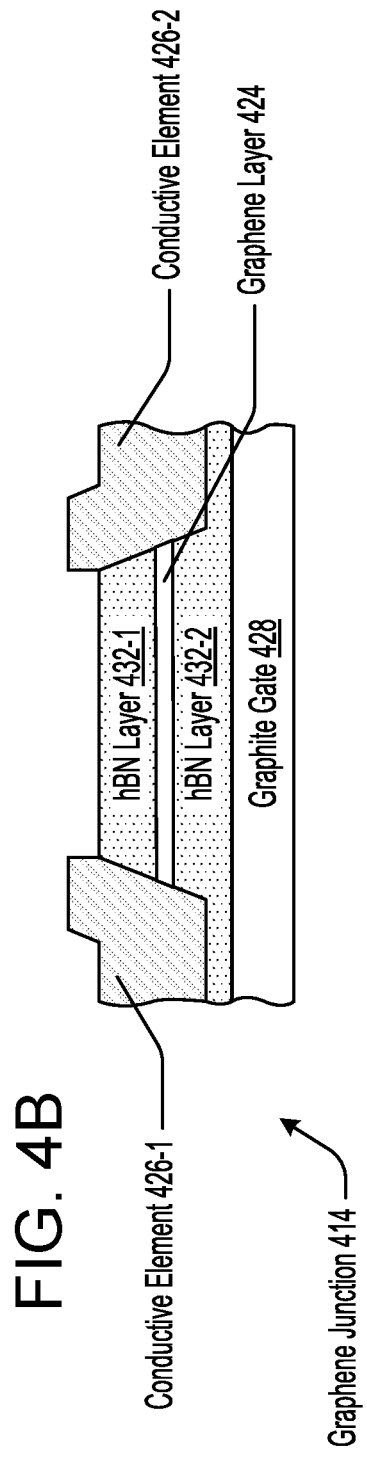

FIGS. 4A and 4B illustrate an example of a graphene junction 414, according to some embodiments of the present disclosure. FIG. 4A illustrates a plan view of graphene junction 414 and FIG. 4B illustrates a cross-section view along plane A-A' in FIG. 4A. In some embodiments, graphene junction 414 is a gJJ. FIG. 4A focuses on the portion of graphene junction 414 that shows the graphene flake encapsulated in hBn (corresponding to hBN layers 432) and contacted by aluminum electrodes (corresponding to conductive elements 426). Two ground wires may span the entire length of the flake.

In some embodiments the resonator-side contact (corresponding to conductive element 426-2) is placed in close proximity to the ground-side contact/ground wire(s) (corresponding to conductive element 426-1) to form the gJJ. A heater-side contact (corresponding to heater line 418) may be placed at a further distance from the ground contacts/electrodes and can be used to apply Joule heating via heater current ($I_{heater}$). FIG. 4B shows the partial cross-section across the gJJ. Encapsulated graphene layer 424 may be sandwiched between hBN layers 432 (specifically, a top hBN layer 432-1 and a bottom hBN layer 432-2) and contacted at the edges by conductive elements 426 to form a S-G-S junction. Tuning the global carrier density in the graphene flake may be achieved by applying the DC voltage $V_{BG}$ to graphite gate 428, which is disposed below bottom hBN layer 432-2.

In some implementations, the resonance structure comprises an interdigitated microwave resonator that is terminated by a graphene flake of approximate area S=25 μm² via a central contact separated by 250 nm from two symmetrically placed contacts shorted to a ground plane. Superconducting aluminum may be used for all contacts since it has a relatively small gap Δ≈140 μeV. This is expected to maximize temperature sensitivity in the sub-Kelvin temperature range. To probe the response of the gJJ supercurrent to changes in electron density and temperature, it may be coupled to an on-chip resonator. Since the gJJ acts as an additional inductive element, it modifies the resonant frequency, which may be measured by means of the S-parameters of the circuit.

The parameters characterizing the gJJ, the Josephson inductance $$L_J = \frac{\Phi_0}{2\pi I_c}$$

and subgap resistance $R_{SG}$, depend strongly on electron density. Accordingly, the resonant frequency and width are both highly dependent on the back gate voltage $V_{BG}$. It is noted that the resonance can be resolved over a large range of gate voltages, which allows phenomena arising from both electron and hole doping to be studied, as well as near charge neutrality ($V_{BG}$≈−0.4 V). For the latter case, the resonance is weakest.

In some embodiments, in addition to the electrostatic doping, the circuit resonance is also strongly dependent upon temperature. When the device temperature increases, the resonance dip shifts to lower frequencies and broadens, reflecting increased losses occurring within the junction. Importantly, the observed shape of the resonance can be fitted using a standard four-parameter Lorentzian fit function at all accessible carrier densities ($2.2 \times 10^{12}$ holes/cm$^2$ < $n_{carrier}$ < $5.5 \times 10^{11}$ electrons/cm$^2$) and temperatures (160 mK < T < 480 mK). The high level of agreement between data and the fit allows one to relate the deduced resonance parameters to the physical properties of the junction. In particular, shifts of resonant frequency f and the overall resonance shape, which is set by internal quality factor $Q_i$, can be related to parameters of the resistively-shunted junction (RSJ) junction model, the gJJ critical current $I_c$, and sub-gap resistance $R_{SG}$. These quantities may determine the small-signal electrical response of the junction at any temperature and doping level. It is noted that a similar estimate for microwave losses in the junction is not accessible from switching current measurements that have typically been employed in gJJ threshold detection schemes.

Figure 5:
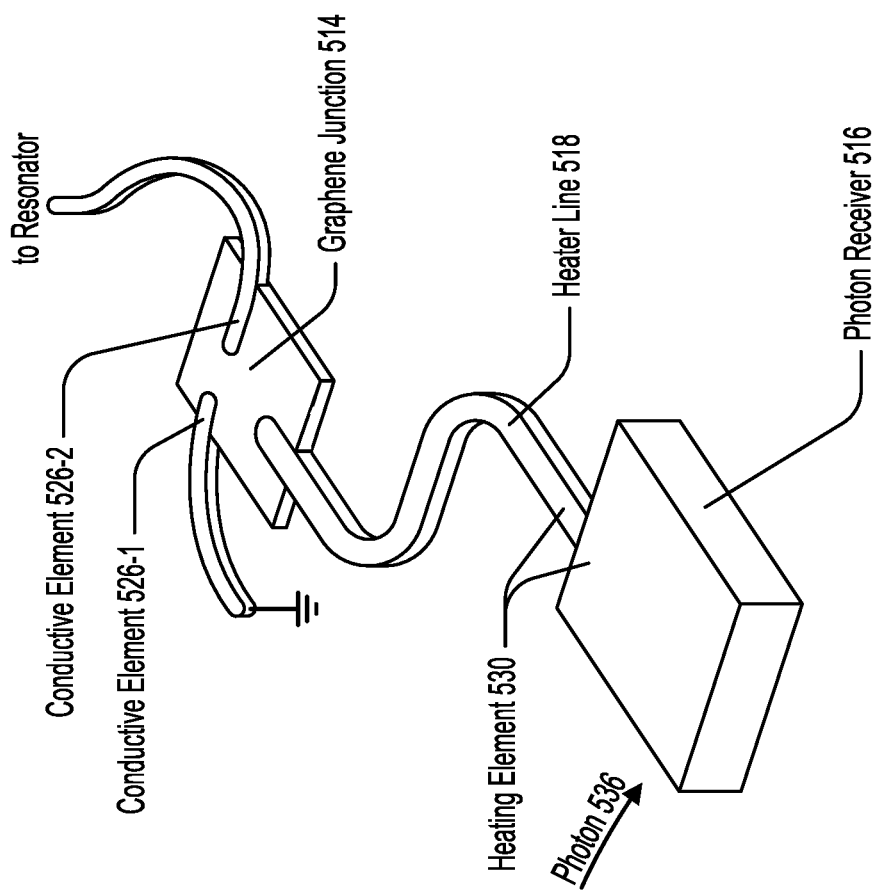
FIG. 5 illustrates a perspective view of an example thermal coupling between a heating element and a graphene junction according to an embodiment of the present invention.

FIG. 5 illustrates a perspective view of an example thermal coupling between a heating element 530 and a graphene junction 514, according to some embodiments of the present disclosure. In the illustrated example, a photon 536 is received by a photon receiver 516, which causes the photon's energy to travel along heater line 518 to cause heating of the graphene layer of graphene junction 514. Graphene junction 514 is formed in part by conductive elements 526, which include a conductive element 526-1 that is electrically grounded and a conductive element 526-2 that is connected to the resonator. Utilizing the structure shown in FIG. 5, photon absorption and measurement of changes in the graphene junction 514 resulting from the photon absorption can be spatially separated to provide photon detector functionality. One of ordinary skill in the art would recognize many variations, modifications, and alternatives.

Figure 6:
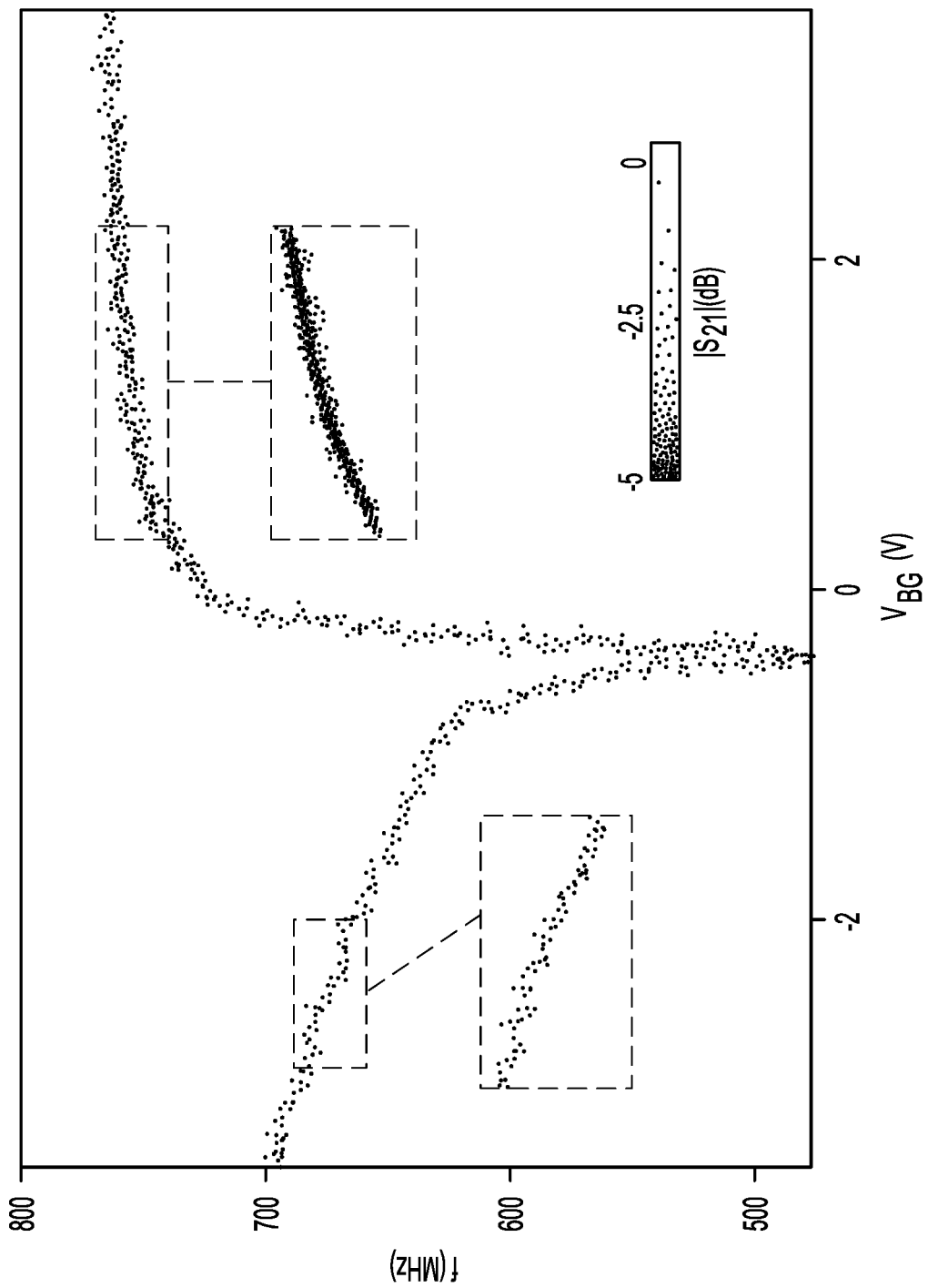
FIG. 6 illustrates an example plot showing measured $S_{21}$ parameter as a function of frequency and DC back gate voltage according to an embodiment of the present invention.

FIG. 6 illustrates an example plot showing measured $S_{21}$ parameter as a function of frequency and DC back gate voltage $V_{BG}$, according to some embodiments of the present disclosure. The illustrated plot shows how the resonant frequency of the resonator can be tuned with applied back gate voltage. Near the charge neutrality point (CNP) ($V_{CNP}$=−0.3 V), the gJJ may maximally load the resonator and consequently minimize the value of the resonant frequency. Far from the CNP, the gJJ acts as a low-inductance termination to the resonator and the resonant frequency approaches its maximum. On the hole-side ($V_{BG}$<$V_{CNP}$), Fabry-Perot type oscillations are visible due to formation of the regions of different doping in the graphene (hole doping; p-type) and in vicinity of contacts (electron doping n-type).

The illustrated plot shows the dependence of the resonant frequency on $V_{BG}$. In some implementations, maximal tuning of resonant frequency $f_0$ with $V_{BG}$ occurs for $V_{CNP}$±0.3V, where the $$\frac{\partial f_0}{\partial V_{BG}} \approx \frac{670 \text{ MHz}}{1 V}.$$

Assuming a parallel-plate capacitance of hBN ($\varepsilon_r$=3) and a separation d=30 nm between the graphene flake and the backgate, $$\frac{\partial f_0}{\partial n_{carrier}} \approx \frac{1.21 \text{ GHz}}{10^{12}/\text{cm}^2}.$$

If the area of the graphene flake is estimated to be A=25 μm$^2$, the maximum sensitivity of the device used as an electrometer is $$\frac{\partial f_0}{\partial N_{carrier}} = \frac{4.84k \text{ Hz}}{\text{charge}}.$$

Figures 7A, 7B, 7C:
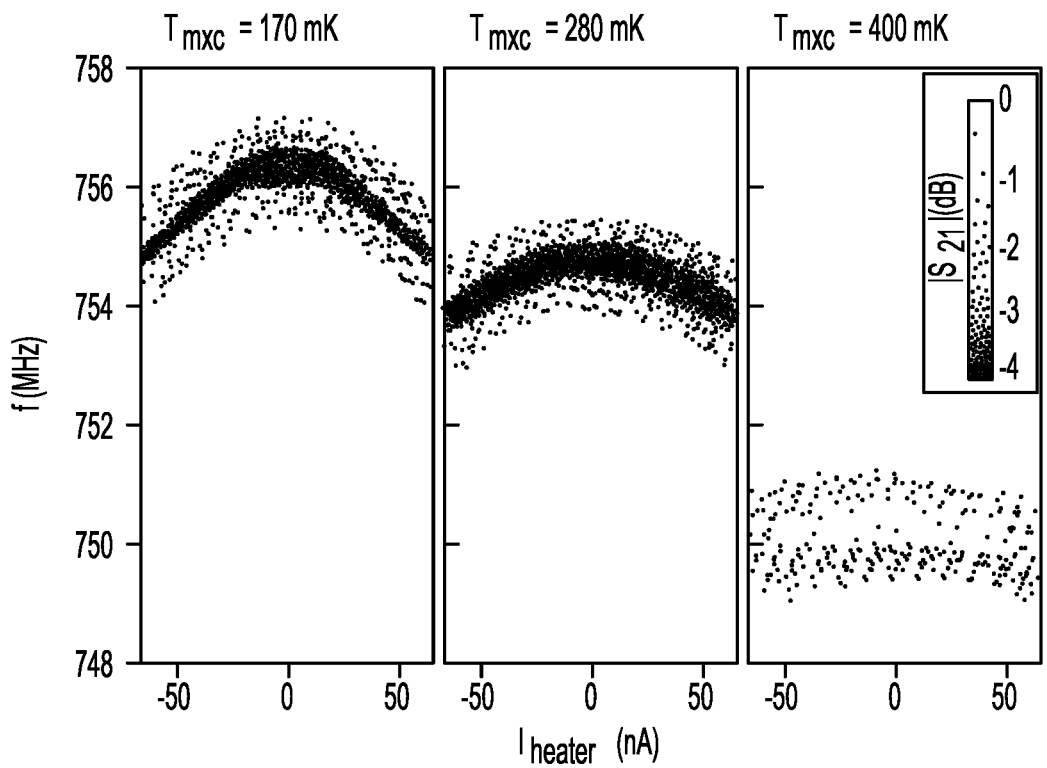
FIGS. 7A-7F illustrate example plots showing $S_{21}$ parameter as a function of resonant frequency, heater current, mixing stage temperature, and carrier doping.
Figures 7D, 7E, 7F:
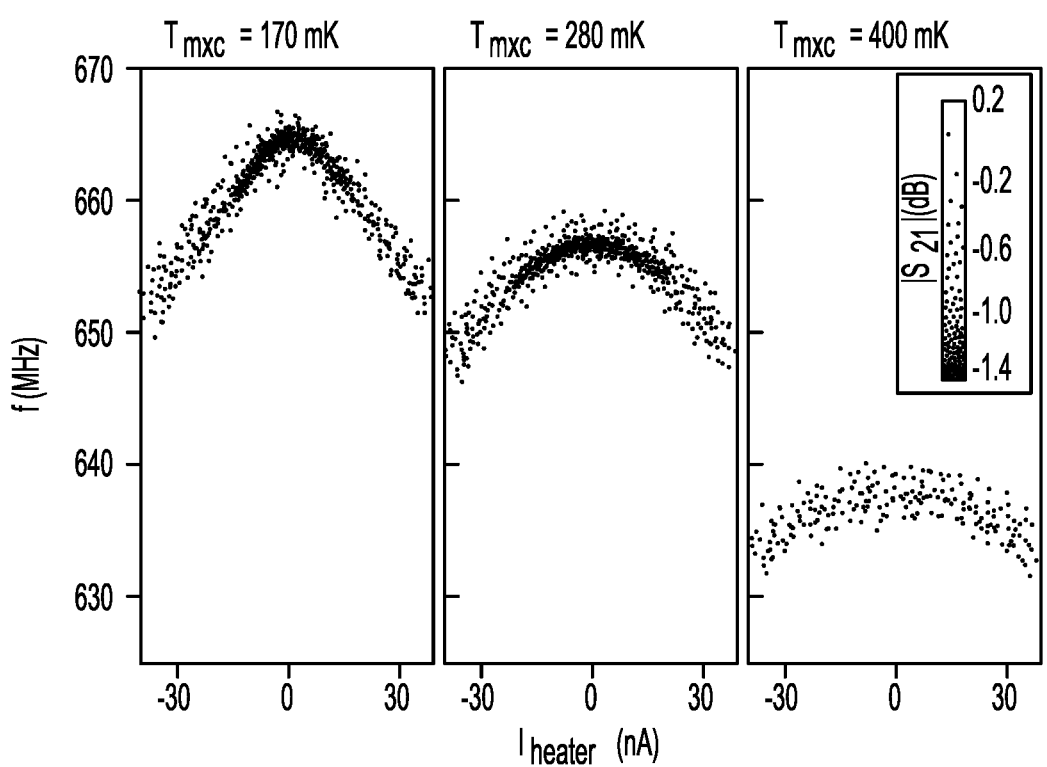

FIGS. 7A-7F illustrate example plots showing $S_{21}$ parameter for a gJJ device as a function of resonant frequency, heater current $I_{heater}$, mixing stage temperature $T_{mxc}$, and carrier doping, according to some embodiments of the present disclosure. FIGS. 7A-7C show electron-side ($V_{BG}$=1.1V) $S_{21}$ parameter values and resonant frequencies for a range of heater currents $I_{heater}$ and for three representative mixing stage temperatures $T_{mxc}$=170 mK, 280 mK, and 400 mK. FIGS. 7D-7F show hole-side ($V_{BG}$=−1.8V) $S_{21}$ parameter values and resonant frequencies for the same mixing stage temperatures $T_{mxc}$=170 mK, 280 mK, and 400 mK. It can be observed that applying a DC heater current $I_{heater}$ to the designated heater port decreases the resonant frequency of the device. As expected, the shifts are symmetric with respect to the polarity of $I_{heater}$. Since the physical junctional parameter $I_c$ monotonically decreases with increasing $T_{mxc}$, there may be a one-to-one correspondence between $I_c$ and $T_{mxc}$, so shifts in $I_c$ can be transduced into shifts of graphene flake temperature.

The experimental data illustrated in FIGS. 7A-7F were obtained using a measurement configuration in which the gJJ is heated internally by applying a DC current $I_{heater}$ to the heater port. The port electrode is placed sufficiently far from the ground electrodes to preclude supercurrent flow. This configuration allows accurate monitoring of the input power delivered to the graphene flake while simultaneously monitoring the resonance frequency. By applying a heater current $I_{heater}$, the internal flake temperature T is increased above $T_{mxc}$, further decreasing the resonant frequency.

In the hole doping regime, a downshift of 27 MHz for holes was obtained, compared to 6 MHz for electrons. This is consistent with greater inductive loading (lower $I_c$) in the hole regime. Combined with the measurements taken at different temperatures for calibration, the power vs. temperature characterization and, consequently, the thermal conductivity $G_{th}$ of the graphene flake can be determined. This approach can be used to investigate thermal properties for both electron and hole doping regimes.

Figure 8:
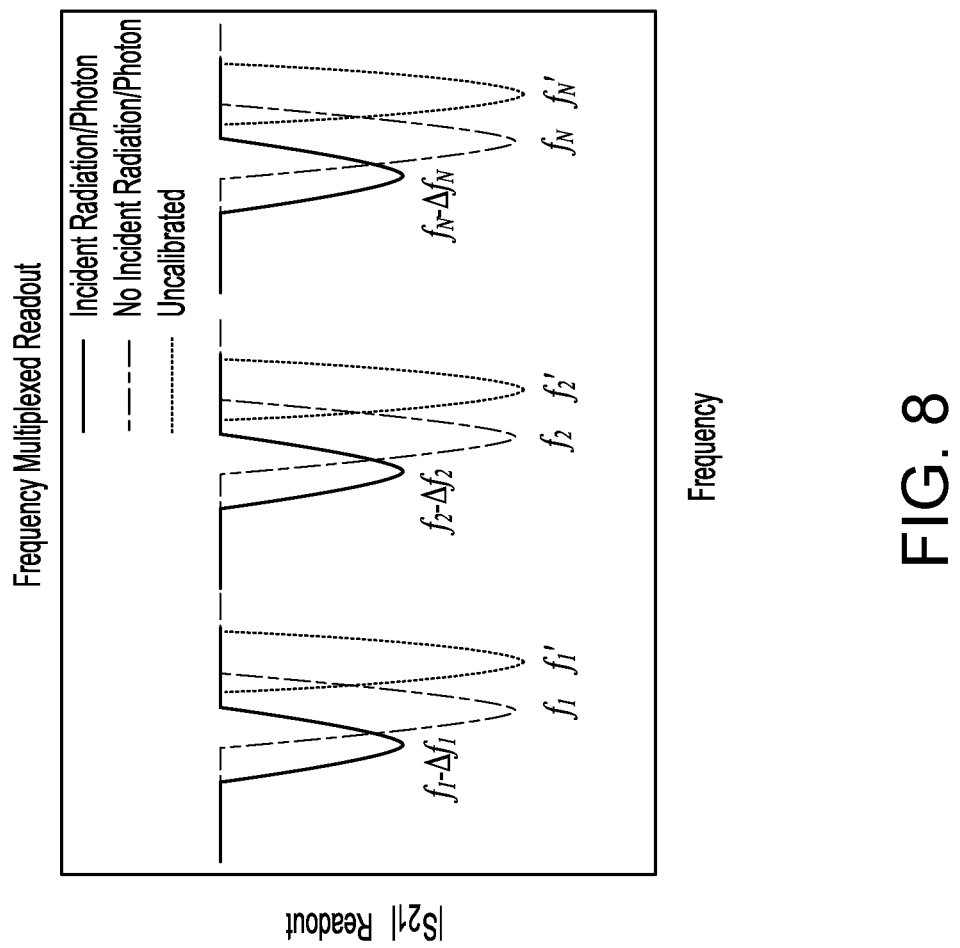
FIG. 8 illustrates an example of a frequency multiplexed readout using a radiation sensor according to an embodiment of the present invention.

FIG. 8 illustrates an example of a frequency multiplexed readout using a radiation sensor, according to some embodiments of the present disclosure. In some embodiments, the architecture of the radiation sensor can allow frequency-multiplexed readout of multiple resonance structures and resonators on a single feedline. In some embodiments, the resonators are associated with uncalibrated resonant frequencies $f_1'$, $f_2'$, . . . , $f_N'$ upon fabrication of the resonators. To tune the resonant frequencies to be aligned with a set of desired resonant frequencies $f_1$, $f_2$, . . . , $f_N$, back gate voltages $V_{BG}$ may be applied to the resonance structures to raise or lower each of the resonant frequencies to achieve an initial operating resonant frequency.

During operation of the radiation sensor, the resonant frequencies may drop by resonant shifts $\Delta f_1$, $\Delta f_2$, . . . $\Delta f_N$, when incident radiation is received by the photon detector(s). For example, upon a photon being received by a first resonance structure having a first resonator with an initial operating resonant frequency $f_1$, the resonant frequency may drop by a frequency shift of $\Delta f_1$, and similarly, upon a photon being received by a second resonance structure having a second resonator with an initial operating resonant frequency $f_2$, the resonant frequency may drop by a frequency shift of $\Delta f_2$. Thereafter, upon cooling of the graphene layers, the resonant frequency of the first resonator may return to $f_1$ and the resonant frequency of the second resonator may return to $f_2$.

In some implementations, each resonator/graphene device is characterized by a resonant frequency that is set by the length of the resonator during fabrication. When the incoming signal has a frequency outside the linewidth of the resonance, the electrical impedance of the resonator/graphene device is large and the signal passes by. When the incoming signal has a frequency within the linewidth of the resonance, the signal is partially absorbed or reflected, resulting in a "resonance dip" in the readout. By fabricating resonators with spaced resonant frequencies, the state of each pixel can be independently interrogated, for example, by sweeping the incident signal frequency or by simultaneously or concurrently tracking multiple input tones. By employing this measurement scheme, frequency-multiplexed readout of arrays of graphene-based radiation detectors can be achieved.

Figure 9:
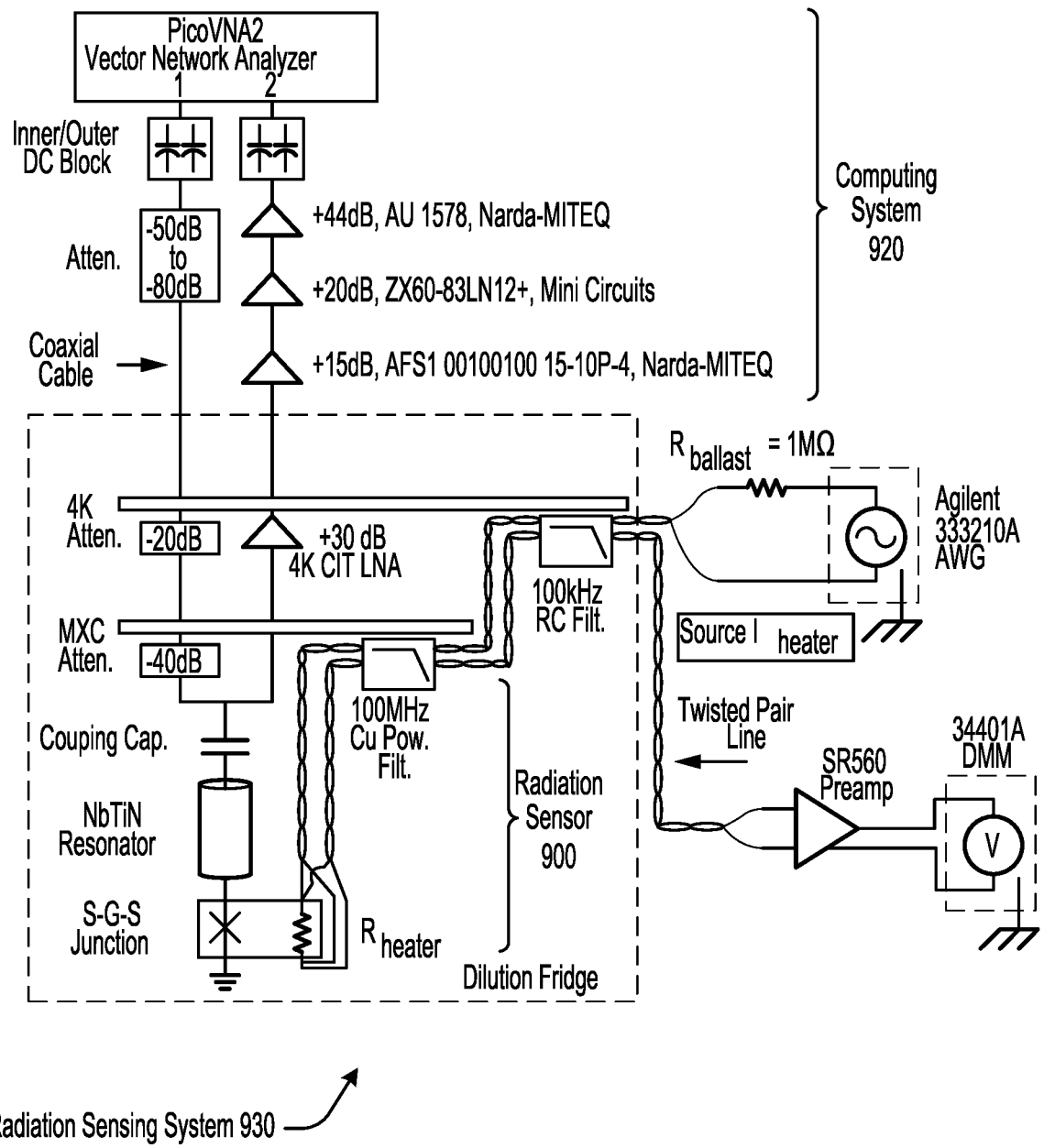
FIG. 9 illustrates an example implementation of a radiation sensing system according to an embodiment of the present invention.

FIG. 9 illustrates an example implementation of a radiation sensing system 930, according to some embodiments of the present disclosure. In the illustrated example, radiation sensing system 930 includes a radiation sensor consisting of a gJJ terminating a superconducting microwave circuit. A superconducting cavity resonator may be patterned from an NbTiN film sputtered on a $SiO_2$ wafer. Coupling to external microwave readout circuitry may be achieved with a series coupling capacitor patterned in the same mask.

Electrical measurement of radiation sensor 900 are performed by a computing system 920. Standard $S_{21}$ transmission measurements may be performed in which a swept microwave tone is sent out of Port 1 of a PicoVNA 2 vector network analyzer (VNA) and down through attenuators and stages of the dilution refrigerator. The impedance of the resonator/gJJ device may load the line and scatter the incoming microwave tone. The transmitted portion of the microwave signal may be amplified by a first-stage $T_n=4K$ CIT low noise amplifier, and then by three room temperature amplifiers, where it is detected by Port 2 of the VNA.

To improve DC isolation between the device and the VNA, inner/outer DC blocks may be included on the ports of the VNA. To vary readout power incident upon the device, the room temperature attenuation may be varied between −50 dB and −80 dB. The attenuation on the fridge stages may ensure that the 300 K noise at room temperature is attenuated below the noise floor of the mixing chamber. Attenuators and amplifiers may be placed immediately under the fridge stage to which they are thermally anchored.

Heater measurements may be performed by applying a DC heater current $I_{heater}$ to the heater port of the graphene flake and reading out the corresponding voltage drop in a 4-wire measurement. To source $I_{heater}$, an Agilent 33210A AWG may output a DC voltage and/or an AC voltage. Since the ballast resistor $R_{ballast}=1$ MΩ is 3 orders-of-magnitude larger than the heater port resistance $R_{heater} \sim 1$ kΩ, the series combination of the AWG and $R_{ballast}$ acts as a current source of $I_{heater}$, to good approximation. The $I_{heater}$ current may travel down PhBr twisted-pair lines to the heater port where it Joule heats the graphene flake. Outside of the fridge, the shield on the twisted pair lines is held at fridge ground. The return line of the twisted pair may be grounded through a 100Ω resistor to a breakout box (not shown) which is also held at fridge ground. The return line terminates at the negative terminal of the AWG. It is noted that the possible ground loop introduced by the grounding of the twisted pair return line through the 100Ω resistor does not have an appreciable effect on any measurements.

Background-subtracted $S_{21}$ transmission data may be fit to a four-parameter fitting function $$S_{21} = 1 - \frac{Q_0/Q_c - 2iQ_0\frac{\delta\omega}{\omega_0}}{1 + 2iQ_0\frac{\omega-\omega_0}{\omega_0}}.$$

Extracted fit parameters include resonant frequency $\omega_0$, internal quality factor $Q_i$, coupling quality factor $Q_c$, and asymmetry parameter $\delta\omega_0$. Total quality factor may be defined as the parallel sum of the dissipation channels $$\frac{1}{Q_0} = \frac{1}{Q_i} + \frac{1}{Q_c}.$$

The device was found in the undercoupled limit ($Q_i < Q_c$) for all backgate voltages, where the total dissipation is dominated by dissipation in the device instead of dissipation in the coupling to the lines.

Figure 10:
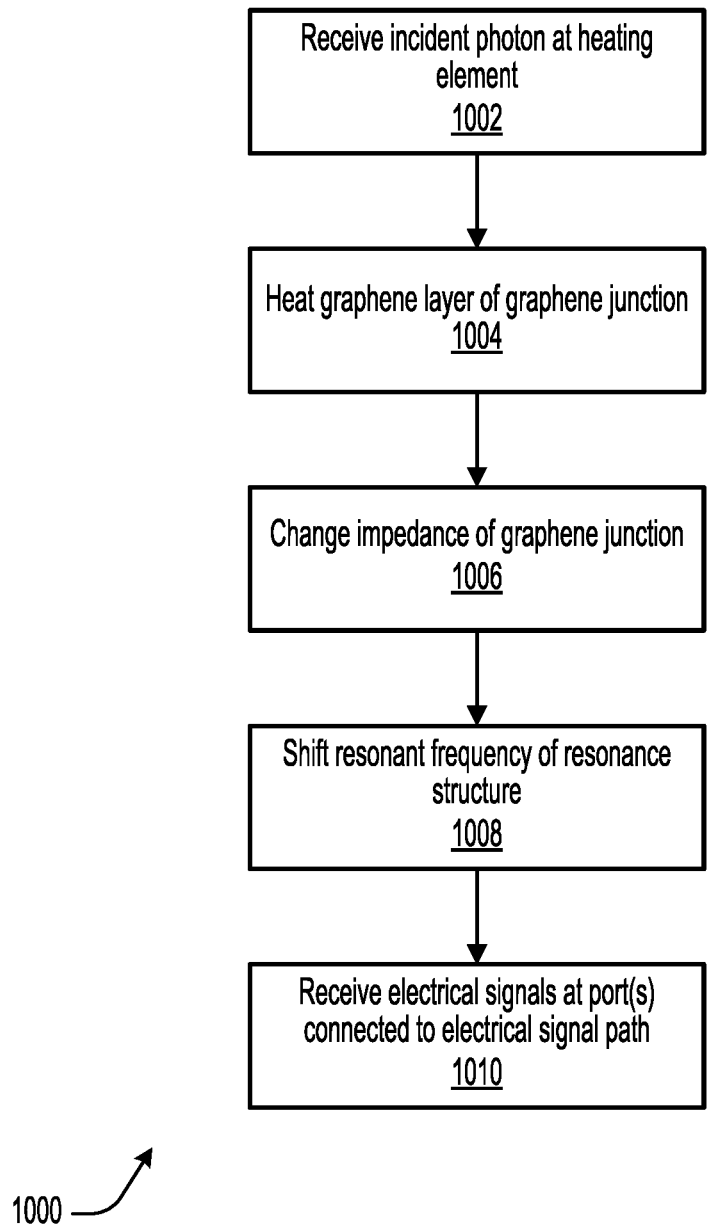
FIG. 10 is a flowchart illustrating a method of operating a radiation sensor according to an embodiment of the present invention.

FIG. 10 is a flowchart illustrating a method 1000 of operating a radiation sensor (e.g., radiation sensors 100, 200, 900), according to some embodiments of the present disclosure.

At step 1002, an incident photon (e.g., photon 536) is received at a heating element (e.g., heating elements 330, 530) of a resonance structure (e.g., resonance structures 202, 302) of the radiation sensor. In some embodiments, the heating element includes a photon receiver (e.g., photon receivers 316, 516) that receives the incident photon.

At step 1004, a graphene layer (e.g., graphene layers 324, 424) of a graphene junction (e.g., graphene junctions 314, 414, 514) of the resonance structure is heated in response to the heating element receiving the incident photon. In some embodiments, the heating element is thermally coupled to the graphene layer. In some embodiments, the heating element includes a heater line 518 that is thermally coupled to the graphene layer. In some embodiments, the incident photon is absorbed by the graphene layer via the heating element.

At step 1006, an impedance of the graphene junction is changed in response to heating the graphene layer. In some embodiments, the impedance of the graphene junction is decreased in response to heating the graphene layer.

At step 1008, a resonant frequency (e.g., resonant frequencies $f_1, f_2, \ldots, f_N$) of a resonator (e.g., resonator 312) of the resonance structure is shifted in response to changing the impedance of the graphene junction. In some embodiments, the resonant frequency is shifted downward in response to changing the impedance of the graphene junction.

At step 1010, electrical signals (e.g., input signals 106, 206) are received at one or more ports coupled to an electrical signal path (e.g., electrical signal paths 204, 304) of the radiation sensor. In some embodiments, the resonance structure is connected to the electrical signal path. In some embodiments, an output signal (e.g., output signals 108, 208) is produced by the radiation sensor in response to receiving the (input) electrical signals. In some embodiments, the output signal is indicative of the shift in the resonant frequency.

It should be appreciated that the specific steps illustrated in FIG. 10 provide a particular method of operating a radiation sensor according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 11:
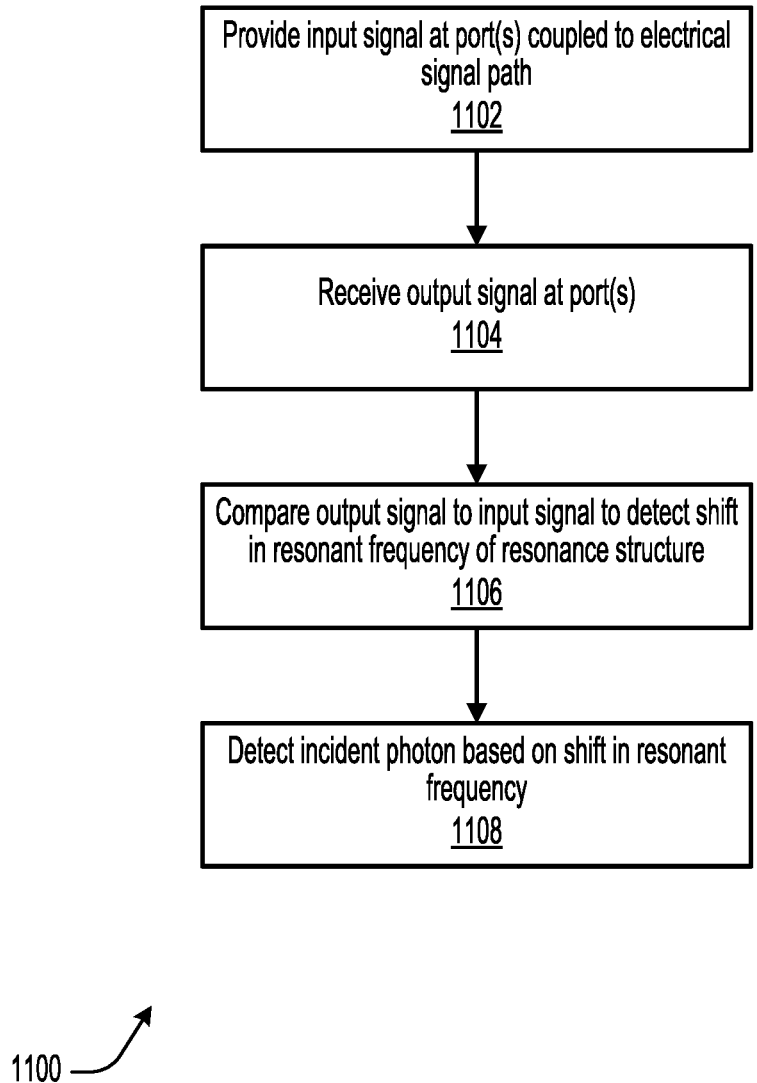
FIG. 11 is a flowchart illustrating a method of making electrical measurements using a radiation sensor according to an embodiment of the present invention.

FIG. 11 is a flowchart illustrating a method 1100 of making electrical measurements using a radiation sensor (e.g., radiation sensors 100, 200, 900), according to some embodiments of the present disclosure. One or more steps of method 1100 may be performed by one or more processors, such as those included in a computing system (e.g., computing systems 120, 920). Method 1100 may be implemented as a computer-readable medium or computer program product comprising instructions which, when the program is executed by one or more computers, cause the one or more computers to carry out the steps of method 1100. Such computer program products can be transmitted, over a wired or wireless network, in a data carrier signal carrying the computer program product.

At step 1102, an input signal (e.g., input signals 106, 206) is provided at one or more ports coupled to an electrical signal path of the radiation sensor (e.g., electrical signal paths 204, 304). In some embodiments, the radiation sensor comprises a resonance structure (e.g., resonance structures 202, 302) connected to the electrical path. In some embodiments, the resonance structure comprises a resonator (e.g., resonator 312), a graphene junction (e.g., graphene junctions 314, 414, 514) connected in series with the resonator and including a graphene layer (e.g., graphene layers 324, 424), and a heating element (e.g., heating elements 330, 530) that converts an incident photon (e.g., photon 536) into heating of the graphene layer.

At step 1104, an output signal (e.g., output signals 108, 208) is received at the one or more ports coupled to the electrical signal path. In some embodiments, the output signal is indicative of a shift in a resonant frequency (e.g., resonant frequencies $f_1, f_2, \ldots, f_N$) of the resonator.

At step 1106, the output signal is compared to the input signal to detect the shift in the resonant frequency of the resonator.

At step 1108, the incident photon is detected based on the shift in the resonant frequency of the resonator.

It should be appreciated that the specific steps illustrated in FIG. 11 provide a particular method of making electrical measurements using a radiation sensor according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 12:
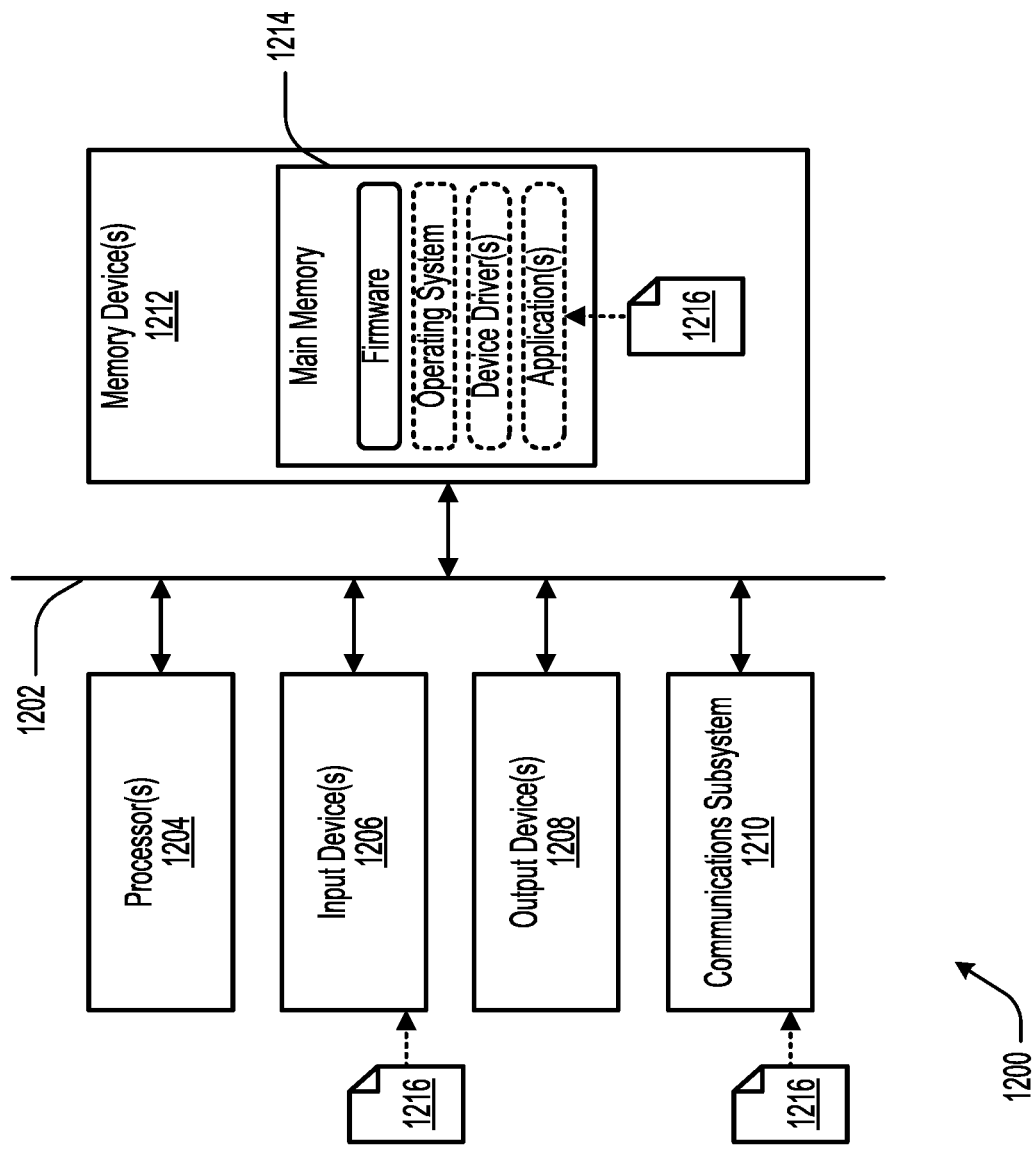
FIG. 12 illustrates an example computer system comprising various hardware elements according to an embodiment of the present invention.

FIG. 12 illustrates an example computer system 1200 comprising various hardware elements, according to some embodiments of the present disclosure. Computer system 1200 may be incorporated into or integrated with devices described herein and/or may be configured to perform some or all of the steps of the methods provided by various embodiments. For example, in various embodiments, computer system 1200 may be incorporated into computing system 120 and/or may be configured to perform method 1100. It should be noted that FIG. 12 is meant only to provide a generalized illustration of various components, any or all of which may be utilized as appropriate. FIG. 12, therefore, broadly illustrates how individual system elements may be implemented in a relatively separated or relatively more integrated manner.

In the illustrated example, computer system 1200 includes a communication medium 1202, one or more processor(s) 1204, one or more input device(s) 1206, one or more output device(s) 1208, a communications subsystem 1210, and one or more memory device(s) 1212. Computer system 1200 may be implemented using various hardware implementations and embedded system technologies. For example, one or more elements of computer system 1200 may be implemented as a field-programmable gate array (FPGA), such as those commercially available by XILINX®, INTEL®, or LATTICE SEMICONDUCTOR®, a system-on-a-chip (SoC), an application-specific integrated circuit (ASIC), an application-specific standard product (ASSP), a microcontroller, and/or a hybrid device, such as an SoC FPGA, among other possibilities.

The various hardware elements of computer system 1200 may be coupled via communication medium 1202. While communication medium 1202 is illustrated as a single connection for purposes of clarity, it should be understood that communication medium 1202 may include various numbers and types of communication media for transferring data between hardware elements. For example, communication medium 1202 may include one or more wires (e.g., conductive traces, paths, or leads on a printed circuit board (PCB) or integrated circuit (IC), microstrips, striplines, coaxial cables), one or more optical waveguides (e.g., optical fibers, strip waveguides), and/or one or more wireless connections or links (e.g., infrared wireless communication, radio communication, microwave wireless communication), among other possibilities.

In some embodiments, communication medium 1202 may include one or more buses connecting pins of the hardware elements of computer system 1200. For example, communication medium 1202 may include a bus connecting processor(s) 1204 with main memory 1214, referred to as a system bus, and a bus connecting main memory 1214 with input device(s) 1206 or output device(s) 1208, referred to as an expansion bus. The system bus may consist of several elements, including an address bus, a data bus, and a control bus. The address bus may carry a memory address from processor(s) 1204 to the address bus circuitry associated with main memory 1214 in order for the data bus to access and carry the data contained at the memory address back to processor(s) 1204. The control bus may carry commands from processor(s) 1204 and return status signals from main memory 1214. Each bus may include multiple wires for carrying multiple bits of information and each bus may support serial or parallel transmission of data.

Processor(s) 1204 may include one or more central processing units (CPUs), graphics processing units (GPUs), neural network processors or accelerators, digital signal processors (DSPs), and/or the like. A CPU may take the form of a microprocessor, which is fabricated on a single IC chip of metal-oxide-semiconductor field-effect transistor (MOSFET) construction. Processor(s) 1204 may include one or more multi-core processors, in which each core may read and execute program instructions simultaneously with the other cores.

Input device(s) 1206 may include one or more of various user input devices such as a mouse, a keyboard, a microphone, as well as various sensor input devices, such as an image capture device, a pressure sensor (e.g., barometer, tactile sensor), a temperature sensor (e.g., thermometer, thermocouple, thermistor), a movement sensor (e.g., accelerometer, gyroscope, tilt sensor), a light sensor (e.g., photodiode, photodetector, charge-coupled device), and/or the like. Input device(s) 1206 may also include devices for reading and/or receiving removable storage devices or other removable media. Such removable media may include optical discs (e.g., Blu-ray discs, DVDs, CDs), memory cards (e.g., CompactFlash card, Secure Digital (SD) card, Memory Stick), floppy disks, Universal Serial Bus (USB) flash drives, external hard disk drives (HDDs) or solid-state drives (SSDs), and/or the like.

Output device(s) 1208 may include one or more of various devices that convert information into human-readable form, such as without limitation a display device, a speaker, a printer, and/or the like. Output device(s) 1208 may also include devices for writing to removable storage devices or other removable media, such as those described in reference to input device(s) 1206. Output device(s) 1208 may also include various actuators for causing physical movement of one or more components. Such actuators may be hydraulic, pneumatic, electric, and may be provided with control signals by computer system 1200.

Communications subsystem 1210 may include hardware components for connecting computer system 1200 to systems or devices that are located external computer system 1200, such as over a computer network. In various embodiments, communications subsystem 1210 may include a wired communication device coupled to one or more input/output ports (e.g., a universal asynchronous receiver-transmitter (UART)), an optical communication device (e.g., an optical modem), an infrared communication device, a radio communication device (e.g., a wireless network interface controller, a BLUETOOTH® device, an IEEE 802.11 device, a Wi-Fi device, a Wi-Max device, a cellular device), among other possibilities.

Memory device(s) 1212 may include the various data storage devices of computer system 1200. For example, memory device(s) 1212 may include various types of computer memory with various response times and capacities, from faster response times and lower capacity memory, such as processor registers and caches (e.g., L0, L1, L2), to medium response time and medium capacity memory, such as random access memory, to lower response times and lower capacity memory, such as solid state drives and hard drive disks. While processor(s) 1204 and memory device(s) 1212 are illustrated as being separate elements, it should be understood that processor(s) 1204 may include varying levels of on-processor memory, such as processor registers and caches that may be utilized by a single processor or shared between multiple processors.

Memory device(s) 1212 may include main memory 1214, which may be directly accessible by processor(s) 1204 via the memory bus of communication medium 1202. For example, processor(s) 1204 may continuously read and execute instructions stored in main memory 1214. As such, various software elements may be loaded into main memory 1214 to be read and executed by processor(s) 1204 as illustrated in FIG. 12. Typically, main memory 1214 is volatile memory, which loses all data when power is turned off and accordingly needs power to preserve stored data. Main memory 1214 may further include a small portion of non-volatile memory containing software (e.g., firmware, such as BIOS) that is used for reading other software stored in memory device(s) 1212 into main memory 1214. In some embodiments, the volatile memory of main memory 1214 is implemented as random-access memory (RAM), such as dynamic RAM (DRAM), and the non-volatile memory of main memory 1214 is implemented as read-only memory (ROM), such as flash memory, erasable programmable read-only memory (EPROM), or electrically erasable programmable read-only memory (EEPROM).

Computer system 1200 may include software elements, shown as being currently located within main memory 1214, which may include an operating system, device driver(s), firmware, compilers, and/or other code, such as one or more application programs, which may include computer programs provided by various embodiments of the present disclosure. Merely by way of example, one or more steps described with respect to any methods discussed above, might be implemented as instructions 1216, executable by computer system 1200. In one example, such instructions 1216 may be received by computer system 1200 using communications subsystem 1210 (e.g., via a wireless or wired signal carrying instructions 1216), carried by communication medium 1202 to memory device(s) 1212, stored within memory device(s) 1212, read into main memory 1214, and executed by processor(s) 1204 to perform one or more steps of the described methods. In another example, instructions 1216 may be received by computer system 1200 using input device(s) 1206 (e.g., via a reader for removable media), carried by communication medium 1202 to memory device(s) 1212, stored within memory device(s) 1212, read into main memory 1214, and executed by processor(s) 1204 to perform one or more steps of the described methods.

In some embodiments of the present disclosure, instructions 1216 are stored on a computer-readable storage medium, or simply computer-readable medium. Such a computer-readable medium may be non-transitory, and may therefore be referred to as a non-transitory computer-readable medium. In some cases, the non-transitory computer-readable medium may be incorporated within computer system 1200. For example, the non-transitory computer-readable medium may be one of memory device(s) 1212, as shown in FIG. 12, with instructions 1216 being stored within memory device(s) 1212. In some cases, the non-transitory computer-readable medium may be separate from computer system 1200. In one example, the non-transitory computer-readable medium may be a removable media provided to input device(s) 1206, such as those described in reference to input device(s) 1206, as shown in FIG. 12, with instructions 1216 being provided to input device(s) 1206. In another example, the non-transitory computer-readable medium may be a component of a remote electronic device, such as a mobile phone, that may wirelessly transmit a data signal carrying instructions 1216 to computer system 1200 using communications subsystem 1216, as shown in FIG. 12, with instructions 1216 being provided to communications subsystem 1210.

Instructions 1216 may take any suitable form to be read and/or executed by computer system 1200. For example, instructions 1216 may be source code (written in a human-readable programming language such as Java, C, C++, C#, Python), object code, assembly language, machine code, microcode, executable code, and/or the like. In one example, instructions 1216 are provided to computer system 1200 in the form of source code, and a compiler is used to translate instructions 1216 from source code to machine code, which may then be read into main memory 1214 for execution by processor(s) 1204. As another example, instructions 1216 are provided to computer system 1200 in the form of an executable file with machine code that may immediately be read into main memory 1214 for execution by processor(s) 1204. In various examples, instructions 1216 may be provided to computer system 1200 in encrypted or unencrypted form, compressed or uncompressed form, as an installation package or an initialization for a broader software deployment, among other possibilities.

In one aspect of the present disclosure, a system (e.g., computer system 1200) is provided to perform methods in accordance with various embodiments of the present disclosure. For example, some embodiments may include a system comprising one or more processors (e.g., processor(s) 1204) that are communicatively coupled to a non-transitory computer-readable medium (e.g., memory device(s) 1212 or main memory 1214). The non-transitory computer-readable medium may have instructions (e.g., instructions 1216) stored therein that, when executed by the one or more processors, cause the one or more processors to perform the methods described in the various embodiments.

In another aspect of the present disclosure, a computer-program product that includes instructions (e.g., instructions 1216) is provided to perform methods in accordance with various embodiments of the present disclosure. The computer-program product may be tangibly embodied in a non-transitory computer-readable medium (e.g., memory device(s) 1212 or main memory 1214). The instructions may be configured to cause one or more processors (e.g., processor(s) 1204) to perform the methods described in the various embodiments.

In another aspect of the present disclosure, a non-transitory computer-readable medium (e.g., memory device(s) 1212 or main memory 1214) is provided. The non-transitory computer-readable medium may have instructions (e.g., instructions 1216) stored therein that, when executed by one or more processors (e.g., processor(s) 1204), cause the one or more processors to perform the methods described in the various embodiments.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of exemplary configurations including implementations. However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Having described several example configurations, various modifications, alternative constructions, and equivalents may be used without departing from the spirit of the disclosure. For example, the above elements may be components of a larger system, wherein other rules may take precedence over or otherwise modify the application of the technology. Also, a number of steps may be undertaken before, during, or after the above elements are considered. Accordingly, the above description does not bind the scope of the claims.

As used herein and in the appended claims, the singular forms "a", "an", and "the" include plural references unless the context clearly dictates otherwise. Thus, for example, reference to "a user" includes reference to one or more of such users, and reference to "a processor" includes reference to one or more processors and equivalents thereof known to those skilled in the art, and so forth.

Also, the words "comprise," "comprising," "contains," "containing," "include," "including," and "includes," when used in this specification and in the following claims, are intended to specify the presence of stated features, integers, components, or steps, but they do not preclude the presence or addition of one or more other features, integers, components, steps, acts, or groups.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A radiation sensor comprising:
   an electrical signal path for carrying electrical signals; and
   a resonance structure connected to the electrical signal path, the resonance structure comprising:
   a resonator having a resonant frequency;
   a graphene junction connected in series with the resonator, the graphene junction including a graphene layer and having an impedance that is dependent on a temperature of the graphene layer, wherein the graphene junction is connected between the resonator and ground; and
   a heating element that is thermally coupled to the graphene layer and is configured to receive an incident photon, wherein the temperature of the graphene layer increases in response to the heating element receiving the incident photon.

2. The radiation sensor of claim 1, wherein the electrical signal path is coupled to at least one port through which electrical measurements can be made to detect a shift in the resonant frequency of the resonator.

3. The radiation sensor of claim 2, wherein the electrical measurements include S-parameter measurements.

4. The radiation sensor of claim 1, wherein the heating element includes a heater line that is connected to the graphene layer at one end of the heater line.

5. The radiation sensor of claim 1, further comprising:
   a back gate voltage circuit that applies a back gate voltage to the graphene junction.

6. The radiation sensor of claim 1, wherein the graphene junction is a superconductor-graphene-superconductor (S-G-S) junction.

7. The radiation sensor of claim 1, wherein the resonator comprises Niobium Titanium Nitride (NbTiN).

8. The radiation sensor of claim 1, further comprising:
   a second resonance structure connected to the electrical signal path, the second resonance structure comprising:

a second resonator having a second resonant frequency different from the resonant frequency;

a second graphene junction connected in series with the second resonator, the second graphene junction including a second graphene layer and having a second impedance that is dependent on a second temperature of the second graphene layer; and a second heating element that is thermally coupled to the second graphene layer and is configured to receive a second incident photon, wherein the temperature of the second graphene layer increases in response to the second heating element receiving the second incident photon.

9. A method of operating a radiation sensor, the method comprising:

receiving an incident photon at a heating element of a resonance structure of the radiation sensor;

heating a graphene layer of a graphene junction of the resonance structure in response to receiving the incident photon;

changing an impedance of the graphene junction in response to heating the graphene layer;

shifting a resonant frequency of a resonator of the resonance structure in response to changing the impedance of the graphene junction, wherein the graphene junction is connected between the resonator and ground; and receiving electrical signals at one or more ports coupled to an electrical signal path of the radiation sensor, wherein the resonance structure is connected to the electrical signal path.

10. The method of claim 9, wherein the electrical signals are provided at the one or more ports to perform electrical measurements to detect a shift in the resonant frequency of the resonator.

11. The method of claim 10, wherein the electrical measurements include S-parameter measurements.

12. The method of claim 9, wherein the heating element includes a heater line that is connected to the graphene layer at one end of the heater line.

13. The method of claim 9, further comprising:

applying a back gate voltage to the graphene junction using a back gate voltage circuit.

14. The method of claim 9, wherein the graphene junction is a superconductor-graphene-superconductor (S-G-S) junction.

15. The method of claim 9, wherein the resonator comprises Niobium Titanium Nitride (NbTiN).

16. A method of making electrical measurements using a radiation sensor, the method comprising:

providing an input signal at one or more ports coupled to an electrical signal path of the radiation sensor, wherein the radiation sensor comprises a resonance structure connected to the electrical signal path, the resonance structure comprising a resonator, a graphene junction connected in series with the resonator and including a graphene layer, and a heating element that converts an incident photon into heating of the graphene layer, wherein the graphene junction is connected between the resonator and ground;

receiving an output signal at the one or more ports coupled to the electrical signal path;

comparing the output signal to the input signal to detect a shift in a resonant frequency of the resonator; and detecting the incident photon based on the shift in the resonant frequency of the resonator.

17. The method of claim 16, wherein the electrical measurements include S-parameter measurements.

18. The method of claim 16, wherein the heating element includes a heater line that is connected to the graphene layer at one end of the heater line.

19. The method of claim 16, wherein the graphene junction is a superconductor-graphene-superconductor (S-G-S) junction.

20. The method of claim 16, wherein the resonator comprises Niobium Titanium Nitride (NbTiN).

* * * * *